(12) United States Patent
Haworth (10) Patent No.: US 6,356,457 B1
(45) Date of Patent: Mar. 12, 2002

(54) CIRCUIT CARD SUPPORT MECHANISM AND METHOD

(75) Inventor: Stephen P Haworth, Amersham (GB)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/326,920

(22) Filed: Jun. 7, 1999

(51) Int. Cl.⁷ .................................................. H05K 7/14
(52) U.S. Cl. ....................... 361/801; 361/684; 361/756; 361/759; 361/802; 211/41.17; 206/706
(58) Field of Search ................................ 361/801, 802, 361/804, 740, 741, 747, 756, 758, 759, 684, 753; 211/41.17; 206/706

(56) References Cited

U.S. PATENT DOCUMENTS

| | | | |
|---|---|---|---|
| 5,383,793 A | * | 1/1995 | Hsu et al. ................... 439/327 |
| 5,457,608 A | * | 10/1995 | Scholder et al. ............ 361/752 |
| 5,544,006 A | | 8/1996 | Radloff et al. |
| 5,706,173 A | * | 1/1998 | Carney et al. .............. 361/740 |

FOREIGN PATENT DOCUMENTS

| | | |
|---|---|---|
| DE | 84 31 787 | 7/1985 |
| DE | 42 10 466 | 6/1993 |
| EP | 0 757 332 | 2/1997 |
| WO | 98/27515 | 6/1998 |
| WO | 00/13786 | 3/2000 |

OTHER PUBLICATIONS

Deering, "Geometry Compression," Computer Graphics Proceedings, 1995, pp. 13–20.
International Search Report, Application No. PCT/US 00/13439, mailed Aug. 23, 2000.

* cited by examiner

Primary Examiner—Jayprakash N. Gandhi
(74) Attorney, Agent, or Firm—Conley, Rose & Tayon, PC; B. Noël Kivlin (57) ABSTRACT

A support mechanism for a part of a circuit card includes a support member (slide) which forms a fixed part. The support member defines a guide. It also includes a slideable member for engaging the circuit card. The slideable member (slider) is slideable along the guide to a position for engaging the card. The slider defines a jaw for engaging the circuit card. The jaw can be provided with a protrusion for engaging with a hole in the corner of a circuit card, for example a PCI card. The mechanism enables the supporting of cards of different lengths due to the slideability of the slide along the guide. The guide and the slider can be formed with inter-engaging structures of appropriate shapes, for example, co-operating dovetail shapes.

28 Claims, 10 Drawing Sheets

CIRCUIT CARD SUPPORT MECHANISM AND METHOD

BACKGROUND OF THE INVENTION

This invention relates to a mechanism and method for supporting a circuit card within a housing.

Various standard forms of circuit cards are known, for example, circuit cards in accordance with the PCI (Peripheral Component Interconnect) standards. Such cards are provided with electrical and mechanical mountings along first and second edges, which means that there is a free corner of the card which is typically unsupported. This can lead to problems in environments where vibration is possible.

In some applications, extremely strict standards are set with regard to the ability to withstand vibration of a unit comprising such a card. For example, in the telecommunications environment, there are extremely rigorous requirements with regard to ensuring that components can operate reliably when subject to vibration due to normal office and/or seismic causes.

There is a need, therefore, to define a structure that can minimise the vulnerability of a card to vibration. One difficulty in addressing this with respect to the mounting of, for example, a card such as a PCI card, is that the length of the card may not be defined by the appropriate standards, for example by the PCI standard specification. As a result, individual cards may have different lengths.

An aim of the invention is to provide a mechanism and method of supporting a part of a circuit card, for example the free corner of a PCI card, which can address the problem of minimizing vibration, while taking account of the fact that different cards to be supported may be of different lengths.

SUMMARY OF THE INVENTION

Particular and preferred aspects of the invention are set out in the accompanying independent and dependent claims. Combinations of features from the dependent claims may be combined with features of the independent claims as appropriate and not merely as explicitly set out in the claims.

In accordance with one aspect of the invention, there is provided a support mechanism for a circuit card. The support mechanism includes a support member that defines a guide. A card engaging member has a guide follower that slideably engages the guide such that the card engaging member is slideable with respect to the support member to a position at which it engages the circuit card.

An embodiment of the present invention thus enables the supporting of a part of the circuit card, for example a free corner, through the card engaging member (slider) and the support member (slide), which co-operate to support the card. The provision of the sliding inter-engagement of the slider and the slide means that the slider be slid along the guide on the slide to a position appropriate for supporting a card of any one of a number of lengths. This facilitates the initial installation of a card, as one support mechanism can support many different card lengths. Accordingly, it is not necessary to hold a set of different supports for different cards. Also, it facilitates the replacement of the circuit card, as the slider can simply be adjusted to a position appropriate for another card of another length.

An advantageous arrangement is for one of the guide and the guide follower to be configured as a rail and the other of the guide and guide follower to be configured as a slot having a complementary shape to the rail. The rail can project from the member on which it is formed so that the slot formed on the other member simply engages over the projecting rail.

The slider can be arranged to be held in a slideable engagement with respect to the slide simply by means of the inter-engagement of the slot and the rail, without any other securing arrangements. For example, the rail can have a head portion that is wider than a base portion. One example of this provides a rail with a dovetail-shaped cross-section.

The guide on the slide may be in the form of a rail, with the guide follower on the slider having the slot of co-operating shape. Alternatively, the guide follower on the slider may be in the form of a rail, with the guide follower on the slide having the slot of co-operating shape.

The slider may have first and second projections forming a jaw for receiving the circuit card. The first and second projections can thus define a slot therebetween for receiving the circuit card. The slider can include a projection, for example within the slot, for engaging in a hole in the circuit card.

In a preferred embodiment of the invention, the slide includes a wall portion for dividing a card receiving bay from a further bay within a housing. The slide can also include formations for securing the slide within the housing. These can take the form of, for example, a flange and/or a threaded hole for receiving a screw. The slide and/or the slider can be formed of an insulating plastics material.

In accordance with another aspect of the invention, there is provided electrical apparatus including a housing, a circuit card and a support mechanism for supporting a part of the circuit card within the housing. The support mechanism includes a support member (slide) defining a guide and a card engaging member (slider) having a guide follower that slideably engages the guide such that the slider is slideable with respect to the support member to a position to engage the part (e.g. a free corner) of the circuit card.

The electrical apparatus can further include a processor card carrying a processor. The slide can be configured to form a dividing wall between a circuit card bay for receiving the circuit card and a processor card bay for receiving the processor card. The slide can thus serve to separate respective flows of cooling air over the circuit card and the processor card from respective fan units. This enable minimisation of the airflow needed for the respective cards (typically a processor card will require more cooling than other cards) and with this a minimisation of the noise generated and optimisation of power consumption for the electrical apparatus as a whole. The apparatus could, for example, be a computer including a processor and a further circuit card (e.g. a PCI card).

In accordance with a further aspect of the invention, there is provided a method of supporting part of a circuit card (e.g., a free corner of a PCI card) within a housing, the method comprising locating a support guide within the housing and sliding a card engaging member (slider) having a guide follower along the guide to a position at which the card engaging member engages the part of the card.

An embodiment of the invention is thus able to accommodate and support a circuit card of any one of a range of lengths in a flexible manner that facilitates initial installation and subsequent replacement of such cards.

BRIEF DESCRIPTION OF THE DRAWINGS

Exemplary embodiments of the present invention will be described hereinafter, by way of example only, with reference to the accompanying drawings in which like reference signs relate to like elements and in which.

DESCRIPTION OF THE PREFERRED EMBODIMENTS

Figure 1:
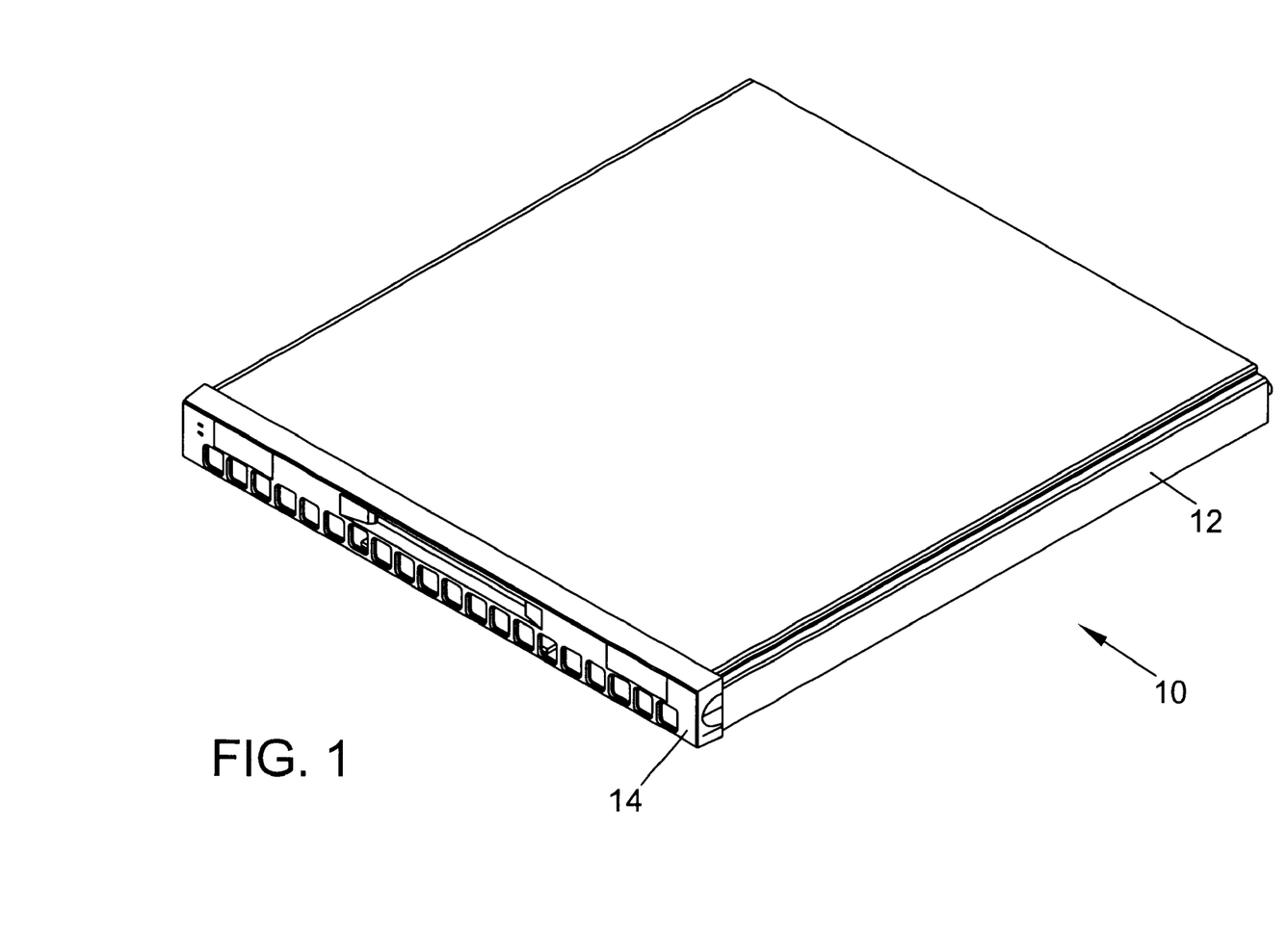
FIG. 1 is a perspective representation of a low profile rack mountable unit.

FIG. 1 is a perspective representation of a low-profile rack-mountable unit 10. The rack-mountable unit can comprise a computer or other system components for mounting in a standard rack, for example, for use in the telecommunications industry. Such a rack-mountable unit can comprise a main body 12 and a front panel 14. Such a rack-mountable unit can have, for example, a height of only about 44 mm (1.75 inches) and a width of approximately 445 mm (17.5 inches) for mounting in racking have a 480 mm (19 inch) spacing. The requirement to provide complex high performance electronic equipment within such a slim form factor, causes considerable challenges with regard to the mounting of the components within the housing 12 in order to provide the necessary component isolation and component cooling.

Figure 2:
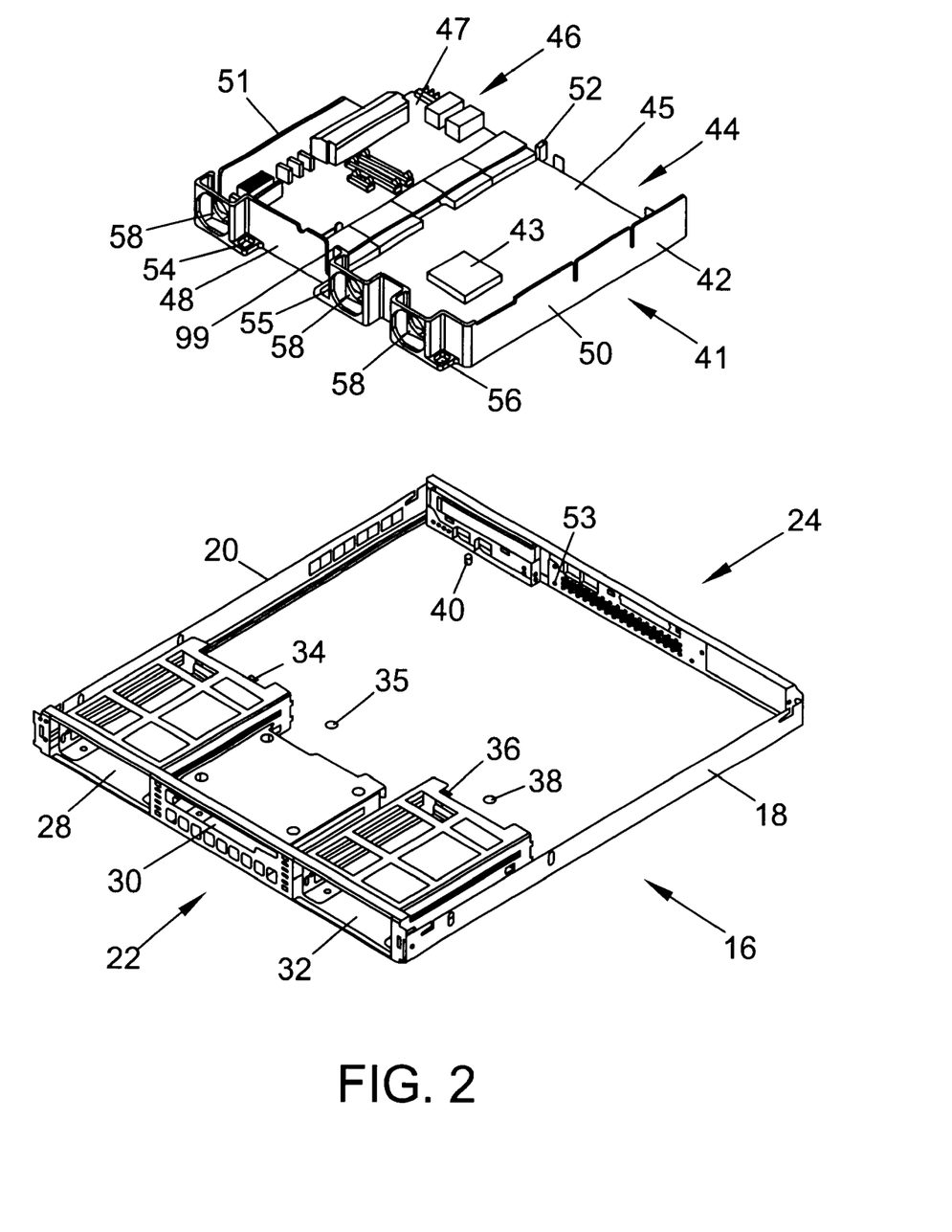
FIG. 2 illustrates a base and insert for a unit as shown in FIG. 1.

FIG. 2 is a partially exploded view of a number of components of an example of a unit shown in FIG. 1.

As shown in FIG. 2, a base unit 16 for the housing 12 comprises first and second side walls 18 and 20, a front end face 22 defining apertures 28, 30 and 32 for receiving media drives (for example, fixed drives in apertures 28 and 32 and a drive having a removable media in aperture 30), a rear wall 24 and a base 26. Formed in the base 26 are a number of hooks (e.g. hooks 34, 35, 36 and 38) and, for example, a mounting peg 40.

Also shown in FIG. 2 is a sub-assembly 41 including a printed circuit board (PCB) support housing 42 for defining a processor card bay 44 and a PCI card bay 46. It can be seen that the PCI card bay includes various components and connectors including a connector 74 for an edge connector of a PCI card. These components and connectors are mounted on an interface PCB 47. A processor motherboard 45 lies within the processor card bay 44 and carries a processor chip 43 and other components (not shown). The support housing 42 includes a front wall 48 and first and second side walls 50 and 51. Latching apertures 54, 55 and 56 are provided adjacent the front wall 48 for engaging with hooks 34, 35 and 36, respectively, in the base unit 16.

Mounting of the sub-assembly 41 in the base unit 16 is effected by engaging the latching apertures 54, 55 and 56 with the respective hooks 34, 35 and 36, and then lowering the rear edge of the sub-assembly 41 over the peg 40. The sub-assembly 41 can then be secured within the base 16 by a snap-fit engagement between a post 52 at the rear of the sub-assembly 42 and a hole 53 in the rear wall 24 of the base unit 16. Alternatively, or in addition, screws may be used, the screws co-operating with a threaded hole in the peg 40 and/or the post 52 to secure the sub-assembly 41 within the base unit 16. As further shown in FIG. 2, the front wall 48 of the support housing 42 is provided with recesses 58 for receiving fan units for cooling components within the PCI card bay 46 and the processor card bay 44.

The support housing 42 of the sub-assembly 41 is preferably made of a plastics material such as a material marketed by General Electric and called Cycoloy No C6200FR. However, any other suitable insulating plastics material may be employed.

Figure 3:
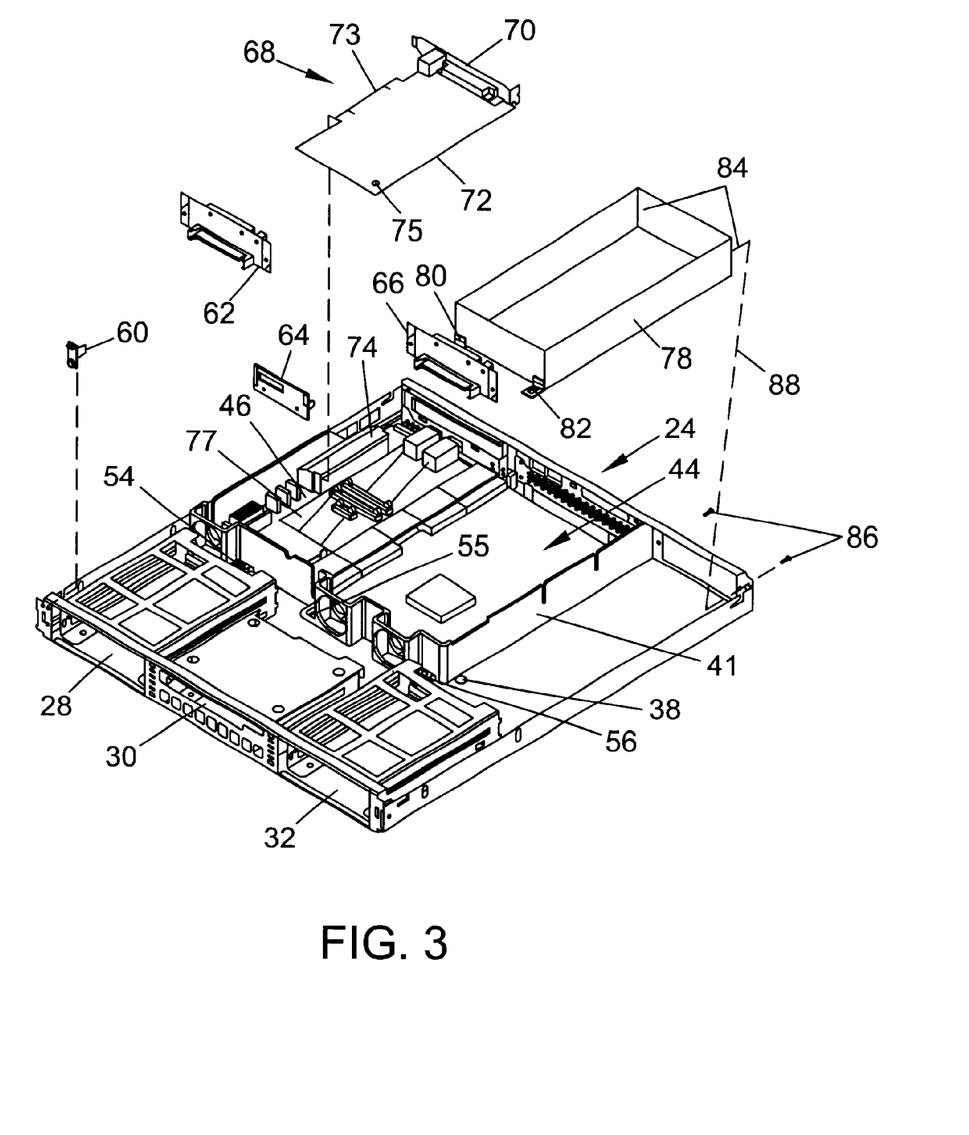
FIG. 3 illustrates further component parts including a PCI card for a unit as shown in FIG. 1.

FIG. 3 illustrates a further stage in the assembly of the rack-mountable unit 12. As shown in FIG. 3, the sub-assembly 41 has already been mounted within the base unit 16, and it can be seen that the latching apertures 54, 55 and 56 have been inserted over the hooks 34, 35 and 36, respectively, and that the peg 52 has engaged with the hole 53 in the rear wall 24 of the base unit 16.

FIG. 3 further shows a number of components for insertion within the base unit 16. These include an LED/jack unit 60 that is mounted at the left hand edge of the base unit as shown, to the left of the media aperture 28. It also includes connector panels 62, 64 and 66 for mounting at the rear of the media apertures 28, 30 and 32 for making electrical and mechanical connections to respective media drives when inserted in the apertures 28, 30 and 32.

Also shown is a PCI card 68. The PCI card 68 has a standard configuration including a rear panel 70, the PCI printed circuit board (PCB) 72 with an edge connector 73 for insertion in the connector 74 within the PCI card bay 46 and a locating hole 75 in a standard position at the free corner 71 of the PCB 72. A further power supply bay receives a box 78 for the power supply. The box includes side walls, front and rear walls, a bottom wall as shown, and also includes a cover (not shown). Latching recesses 80 and 82 are provided for engagement with a hook 38 and a further hook (not shown) in the base unit 16, the box 78 being secured in place by means of screws 86 that co-operate with holes 84 in the rear wall of the box 78.

The hatched area 77 within the PCI card bay 46 is representative of the fact that a further board may be located below the PCI card 68 within the PCI card bay 46.

Figure 4:
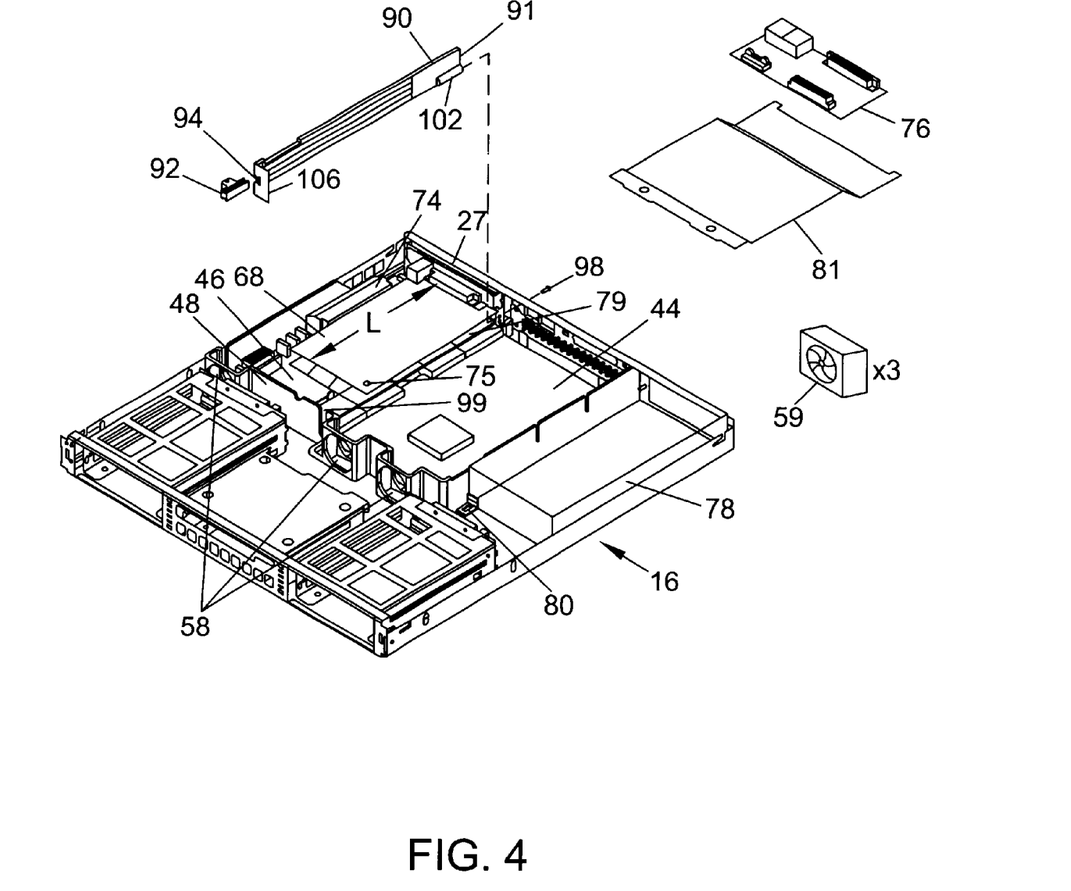
FIG. 4 illustrates further component parts, including a slide and slider for mounting a PCI card, for a unit as shown in FIG. 1.

FIG. 4 illustrates the base unit 16 with the additional components indicated in FIG. 3 mounted in place. In particular, it can be seen that the PCI card 68 is mounted within the PCI card bay 46 with the edge connector 73 inserted within the connector 74 and the box 78 is also mounted within the base unit 16.

It can be seen that the edge 79 of the PCI card 68 is unsupported within the PCI card bay 46. Also, no separation is provided between the PCI card bay 46 and the processor card bay 44. As a result, in the configuration shown in FIG. 4, it would not be possible to provide separate cooling of the processor and PCI card bays, which is desirable for reasons of providing efficient cooling with a minimum of energy expended and noise generated. Accordingly, it is desirable to provide a separation between the PCI card bay 46 and the processor card bay 44, and, further, to support the free corner 71 at the edge 79 of the PCI card 68 to avoid potential problems due to vibration of the rack-mountable unit 10 and/or mishandling of the rack-mountable unit 10. However, it is not straightforward to provide a support for a PCI card, as different PCI cards can have different lengths L in accordance with the PCI standard, although the other dimensions of a PCI card are fixed, including the provision of the hole 75 at the corner of the PCI PCB 72 shown in FIG. 4.

Accordingly, in an embodiment of the invention, in order to provide a flexible mounting arrangement for supporting a PCI card, bearing in mind that the length L of PCI cards can vary, there is provided a slide and slider arrangement 90/92, with the slider 92 forming a slideable member slideable along a guide 94 of the slide 90, which forms a support member. The slider 92 is configured to engage around the edge 79 of the PCI card 68. Preferably, the slider 92 is provided with a detent mechanism (e.g., a bump) for latching with the hole 75 in the free corner 71 of the PCI card 68.

In order to assemble the slide and slider arrangement, the slider 92 is first of all engaged with the guide 94 and is kept near to the front of the slide 90 (i.e., the left hand end as shown in FIG. 4). The front end (i.e., the left hand end as shown in FIG. 4) of the slide 90 is then inserted within the slot 99 in the front wall 46 of the sub-assembly 42. The slide is lowered within the slot 99 so that a flange 106 at the front end of the slide 90 is spaced from the front wall 48 of the sub-assembly 42. This enables the rear end of the slide 90 to clear a lip 27 at the top of the rear wall 26 of the base unit 16. The slide unit 90 can then be slid backwards within the base unit 16 so that the rear face of the flange 106 contacts with the front wall of the sub-assembly 42. Also, during this movement a peg (not shown in FIG. 4) on the rear side of the flange 106 engages within a hole (also not shown in FIG. 4) to the right-hand side of the slot 99 (as shown in FIG. 4) in the front wall 48 of the sub-assembly 16.

Following this movement, the rear end 91 of the slide 90 is adjacent to the inner edge of the rear wall 26, and the slide can be secured in position by means of a screw 98 which engages with a threaded aperture within a raised portion 102 at the rear of the slide 90. The slider 92 is then slid rearwardly along the guide 94 of the slide 90 until a slot formed in the slider 92 engages the free corner 71 on the edge 79 of the PCI card 68.

As will be explained in more detail with respect to FIG. 6, an arrangement is provided to engage with the hole 75 so that the slider is then held in position with respect to the guide 94 of the slide 90, while at the same time providing support for the free corner 71 of the PCI card 68 with respect to the slide 90. If, at any time, it is desired to remove or replace the PCI card 68, this can readily be achieved by sliding forward the slide 92 on the slider 90, replacing the PCI card, and then sliding the slider 92 so that it engages the hole 75 in the replacement PCI card (of whatever length). As a result of the sliding engagement between slider 92 and the slide 92, PCI cards of any length can be supported within the PCI bay 46. The slide and slider arrangement can also be made of GE Cycoloy No C6200FR, or indeed of any other suitable insulating plastics material.

It can be seen, therefore, that the slide 90 forms a fixed support part and the slider 92 provides a slideable part, the slide and slider together co-operating to provide a support mechanism for a circuit card.

FIG. 5 illustrates in more detail one embodiment of the slide 90. As can be seen in FIG. 5A, the slide 90 includes an elongate wall portion 100 that forms the main body of the slide. A guide 94 is formed in the longitudinal direction in or on the face of the wall 100 that, in use, faces the PCI card 68. Towards a rear end 91 of the wall 100 in this example of the slide there is formed, on the same side as the guide 94, an slotted protrusion 104 for engaging over the PCI card at the rear end of the PCI card. This is a fixed slot formed with a pair of jaws that engage on either side of the PCI card. This portion is optional, and, if provided, can be dimensioned to provide a gentle snap fit of the card within the slot, so that it may be inserted and removed easily, but still assists in locating the rear end of the PCI card. An alternative construction, for example as described with reference to another embodiment shown in FIGS. 7A–7D could be provided instead, or this aspect could be omitted completely.

Figure 5A:
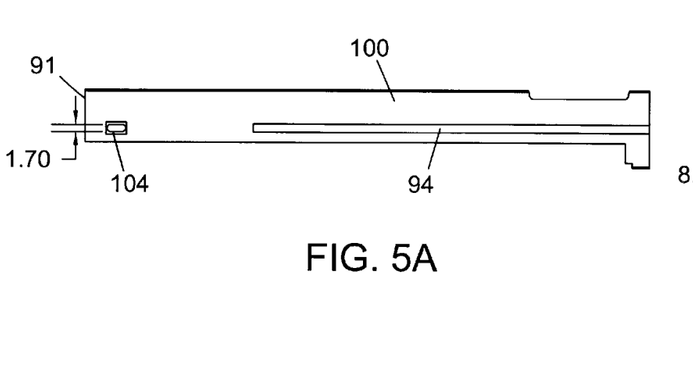
FIGS. 5A–5D illustrate different views of an embodiment of a slide.
Figure 5B:
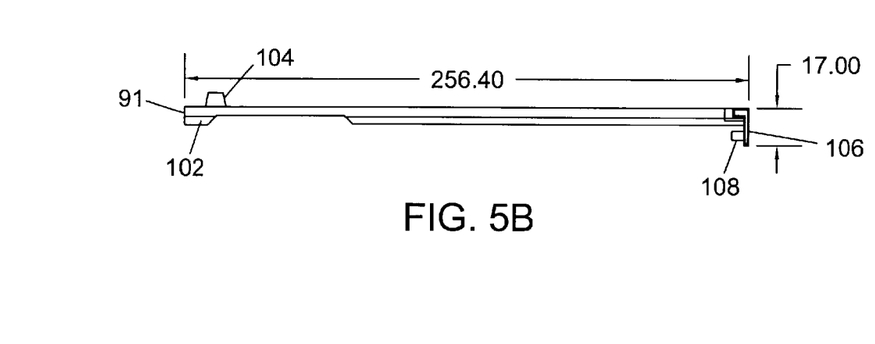

As shown in plan view in FIG. 5B, on the face opposite to the guide 94, and at the rear end of the wall 100, there is provided a raised portion 102 containing a threaded hole for receiving the screw 98. At the opposite end of the wall 100, there is provided the flange 106 already referred to. As can be seen, at the rear of the flange 106, there is provided a peg 108, which engages with a hole (not shown) in the front wall 48 of the sub-assembly 41 adjacent to the slot 99. The inter-engagement of the peg 108 and the hole enables the front of the slide to be located and held in an appropriate position between the PCI bay 46 and the microprocessor bay 44 of the sub-assembly 41.

Figure 5C:
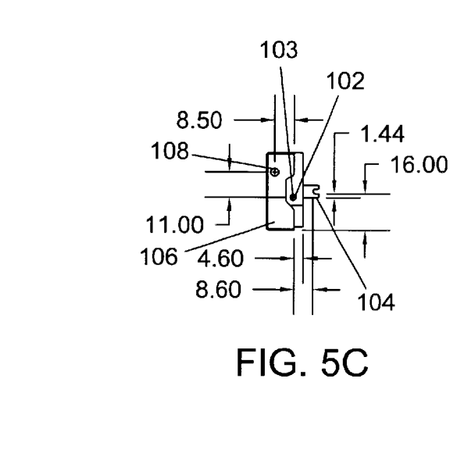

FIG. 5C illustrates a rear end view of the slide 90 showing the threaded hole 103 in the raised portion 102, and also showing the peg 108 in the rear of the flange 106, as well as the slotted protrusion 104.

Figure 5D:
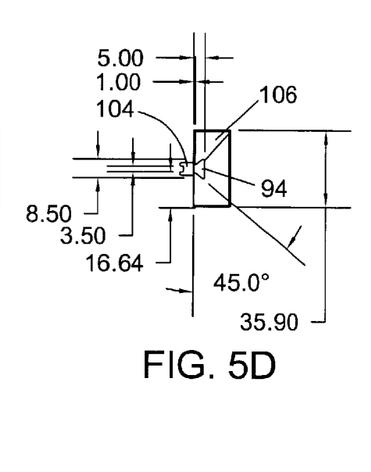

FIG. 5D is a front view of the slide 90, showing, in particular, the front face of the flange 106, the guide 94, and the slotted protrusion 104. It will be noted that, in the present instance, the guide 94 is formed as a dovetail-shaped slot in the slide 90. However, as will be explained later, this is but one example of a possible form for the guide.

FIG. 6 illustrates one example of a slider 92 for use with the slide 90 of FIGS. 5A–5D.

Figure 6A:
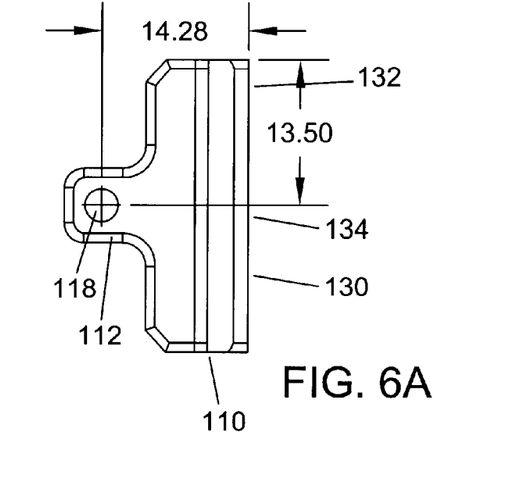
FIGS. 6A–6D illustrate different views of an embodiment of a slider for use with the slide of FIGS. 5A–5D.

FIG. 6A is a plan view of the slider 92, showing a main body portion 110 including first and second side portions 130 and 132, and a central portion 134. In the area of the central portion 134, there is a protrusion 112 that forms one of a pair of jaws for engaging either side of the PCB 72 of the PCI card 68.

Figure 6B:
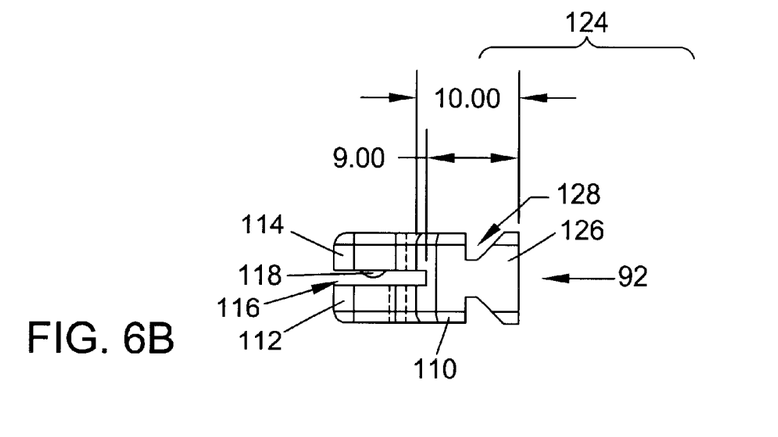

FIG. 6B is a first end view of the slider 92 showing the first and the second jaws 112 and 114 with, formed therebetween, a slot 116 for receiving the PCB 72 of the PCI card 68. Also shown, is a bump 118 (also represented in FIG. 6A) for snapping into the hole 75 in the corner of the PCB 72 of the PCI card 68. FIG. 6B also illustrates a dovetail-shaped protrusion 126 at the right-hand end, as shown in FIG. 6B, of the main body 110. This dovetail-shaped protrusion 126, in combination with the portion of reduced width 128 together form a guide follower 124 for engaging with the guide 94 of the slide 90.

Figure 6C:
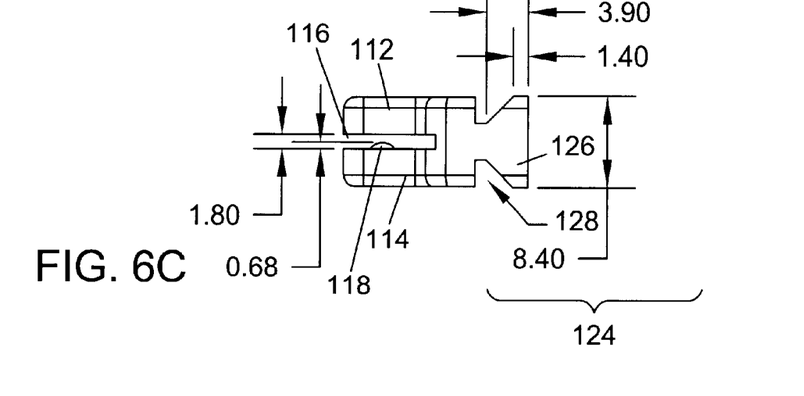

FIG. 6C is the other end view of the slider 92.

Figure 6D:
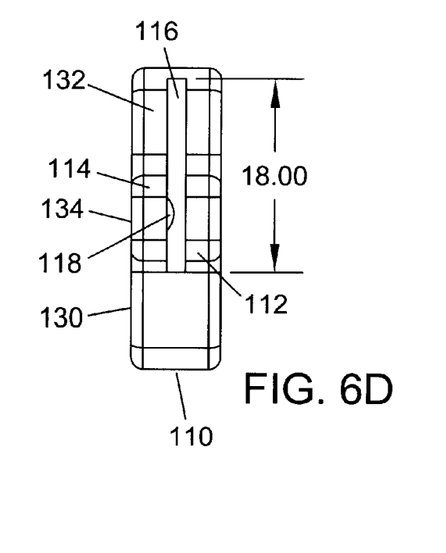

FIG. 6D is a side view, viewed from the left as shown in FIG. 6A, of the slider 92. This illustrates the first and second jaws 112 and 114 for engaging either side of the PCB 72 of the PCI card 68 and the bump 118 for snapping into the hole 75 in the corner of PCB for ensuring and maintaining the correct location of the slider 92 with respect to the PCB 72. Thus the slider 92, in combination with the slide 90 serve to support the PCI card within the apparatus.

FIG. 7 illustrates an alternative embodiment 190 of the slide 90. As can be seen in FIG. 7A, the slide 190 includes an elongate wall portion 200 that forms the main body of the slide. A guide 194 is formed in the longitudinal direction in one face of the wall 200 that, in use, faces the PCI card 68. Towards a rear end 191 of the wall 100 in this example of the slide there is formed, on the same side as the guide 94, an integral spring, or resilient, member 204 which, in use, urges against the edge of a PCI card to assist in locating the PCI card and to absorb any vibration at the rear of the PCI card. This forms one alternative to the slotted protrusion 104 of the slide of FIGS. 5A–5D. The integral spring member has advantages regarding ease of mounting and dismounting of the PCI card and mounting of a blanking plate when a PCI card is not inserted. It will be appreciated that many other alternative constructions for the member 204 could be employed, or indeed the member 204 could be omitted altogether As shown in plan view in FIG. 7B, on the face opposite to the guide 194, and at the rear end of the wall 200, there is provided a raised portion 202 containing a threaded hole for receiving the screw 98. At the opposite end of the wall 200, there is provided a flange 206 corresponding to the flange 106 of the embodiment of FIGS. 5A–5D. At the rear of the flange 206 a peg 208 is provided for engaging with a hole (not shown) in the front wall 48 of the sub-assembly 41 adjacent to the slot 99. The inter-engagement of the peg 108 and the hole enables the front of the slide to be located and held in an appropriate position between the PCI bay 46 and the microprocessor bay 44 of the sub-assembly 41.

Figure 7A:
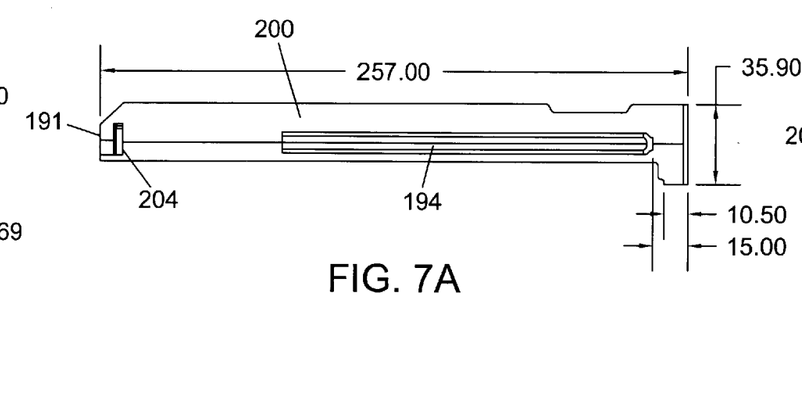
FIGS. 7A–7D illustrate different views of another embodiment of a slide.
Figure 7B:
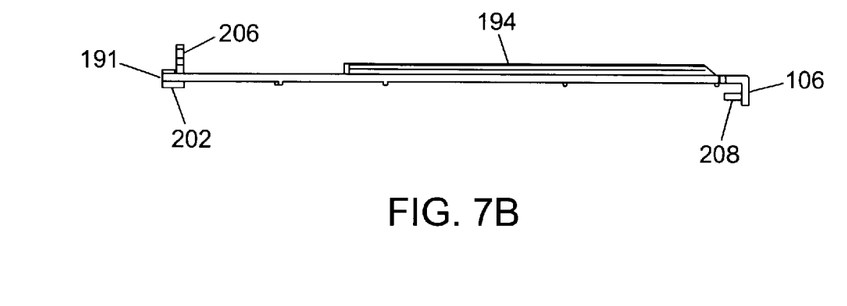
Figure 7C:
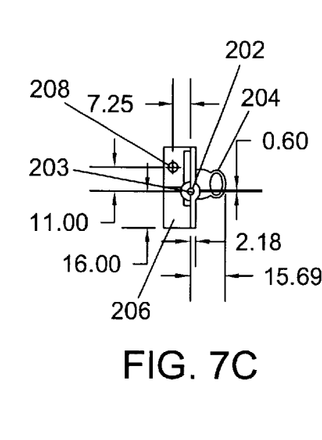

FIG. 7C illustrates a rear end view of the slide 190 showing the threaded hole 203 in the raised portion 202, and also showing the peg 208 in the rear of the flange 206, as well as the spring member 204.

Figure 7D:
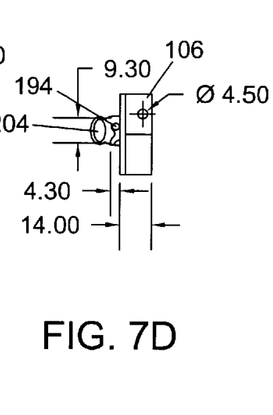

FIG. 7D is a front view of the slide 190, showing, in particular, the front face of the flange 206, the guide 194, and the spring member 204. It will be noted that, in the present instance, the guide 194 is formed as a dovetail-shaped protrusion extending from one face of the slide 190. It will be appreciated that this is merely a further example of a possible form for the guide.

FIG. 8 illustrates one example of a slider 192 for use with the slide 190 of FIGS. 7A–7D.

Figures 8A, 8B, 8D:
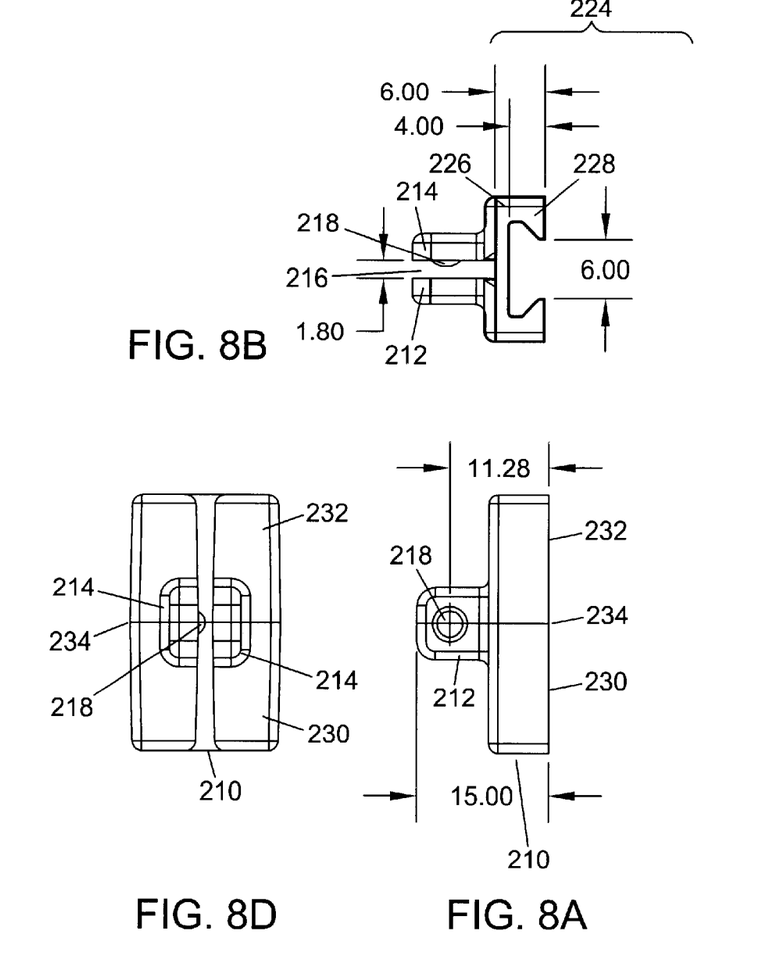
FIGS. 8A–8D illustrate different views of another embodiment of a slider for use with the slide of FIGS. 8A–8D.

FIG. 8A is a plan view of the slider 192, showing a main body portion 210 including first and second side portions 230 and 232, and a central portion 234. In the area of the central portion 234, there is a protrusion 212 that forms one of a pair of jaws for engaging either side of the PCB 72 of the PCI card 68.

FIG. 8B is a first end view of the slider 192 showing the first and the second jaws 212 and 214 with, formed therebetween, a slot 216 for receiving the PCB 72 of the PCI card 68. Also shown, is a bump 218 (also represented in FIG. 8A) for snapping into the hole 75 in the corner of the PCB 72 of the PCI card 68. FIG. 8B also illustrates a dovetail-shaped slot 226 at the right-hand end, as shown in FIG. 8B, of the main body 210. This dovetail-shaped slot 226, in combination with the portion of reduced width 228 together form a guide follower 224 for engaging with the guide 194 of the slide 190.

Figure 8C:
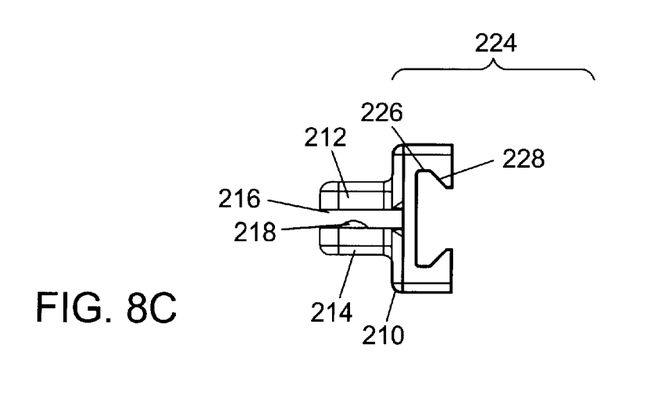

FIG. 8C is the other end view of the slider 192.

FIG. 8D is a side view, viewed from the left as shown in FIG. 8A, of the slider 192. This illustrates the first and second jaws 212 and 214 for engaging either side of the PCB 72 of the PCI card 68 and the bump 218 for snapping into the hole 75 in the corner of PCB.

In FIGS. 5 to 8 various dimensions are illustrated. These dimensions are in millimeters, and represent examples only of a possible size and configuration of the slide and slider arrangement. It will be appreciated that these dimensions can be changed dependent upon a particular implementation and configuration. Indeed, it will be appreciated that many changes and modifications may be made to the embodiment shown. For example, the provision of a flange 106/206 with the peg 108/208 at the front end of the slide 90/190, could be replaced by any other mechanism for securing the front end of the slide 90/190.

Also, the guide and co-operating guide follower of the slide and slider could take many different forms. Various alternatives are shown, by way of example only, in FIG. 9.

Figure 9A:
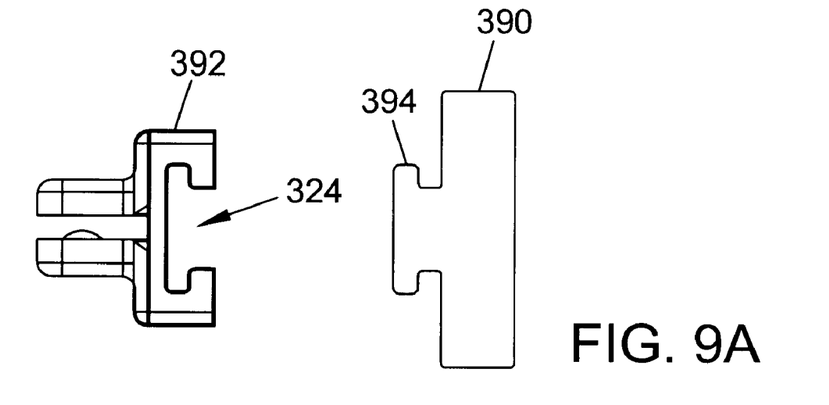
FIGS. 9A–9C illustrate various alternative configurations for a slide and slider.

FIG. 9A illustrates an arrangement where a slider 392 has a T-shaped slot 324, and a slide 390 is provided with a guide 394 having a protrusion with a T-shaped cross-section.

Figure 9B:
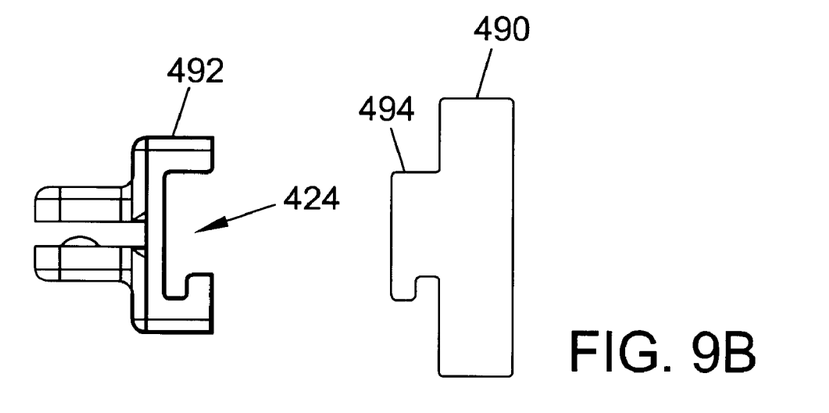

In the example shown in FIG. 9B, a slider 492 has an L-shaped slot 424 and a slide 490 is formed with a guide 494 having a protrusion with an L-shaped cross-section.

Figure 9C:
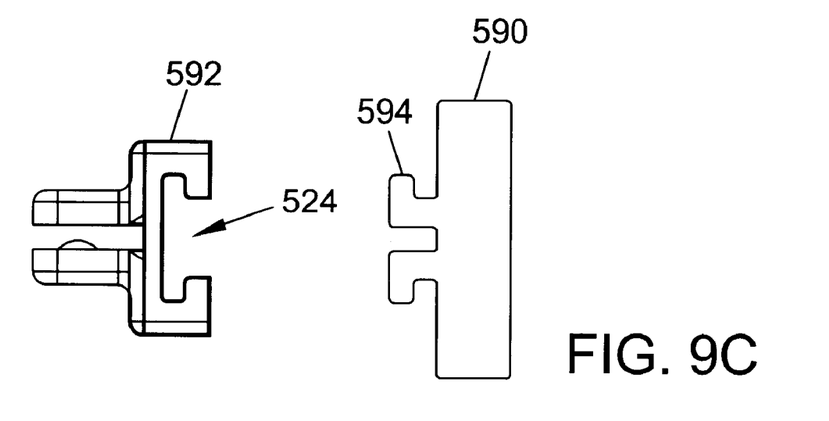

In the example shown in FIG. 9C, a slider 592 has a T-shaped cross section 524, and a slide 590 is formed with a guide 594 that comprises two protrusions, each having an L-shaped cross-section, with the base of the L of each protrusion facing in opposite directions. In the example shown in FIG. 7D, the engagement of the protrusions forming the guide 594 with the slot 524 can be such that a slight springiness in the legs of the L-shaped protrusions enables co-operation between the slider 592 and the slide 590 in such a manner as to provide a firm inter-engagement of the slider 592 with the slide 590, whilst still permitting ready sliding of the member along the guide 592. This arrangement enables the slide and slider arrangement to be manufactured with less stringent manufacturing tolerance requirements than the more rigid structures shown in FIGS. 4–8, 9A and 9B.

Returning to FIG. 4, it will be noted that this also shows a processor baffle 81, that is arranged to overlie the processor chip 43 and other components on the processor PCB 45 and to direct airflow from the two fan units 59, to be mounted in the two recesses 58 associated with the processor card bay 44, over the processor chip and those other components on the processor PCB 45 and out through ventilation holes in the rear wall 24 of the base unit 16.

Further steps in the assembly of the rack-mountable unit 10, which will not be described in detail as not being essential to an understanding of the invention include the attachment of the cabling (not shown) between the various components of the rack mounted unit, this being done at appropriate stages during assembly, and the fitting of a top cover 600.

Figure 10:
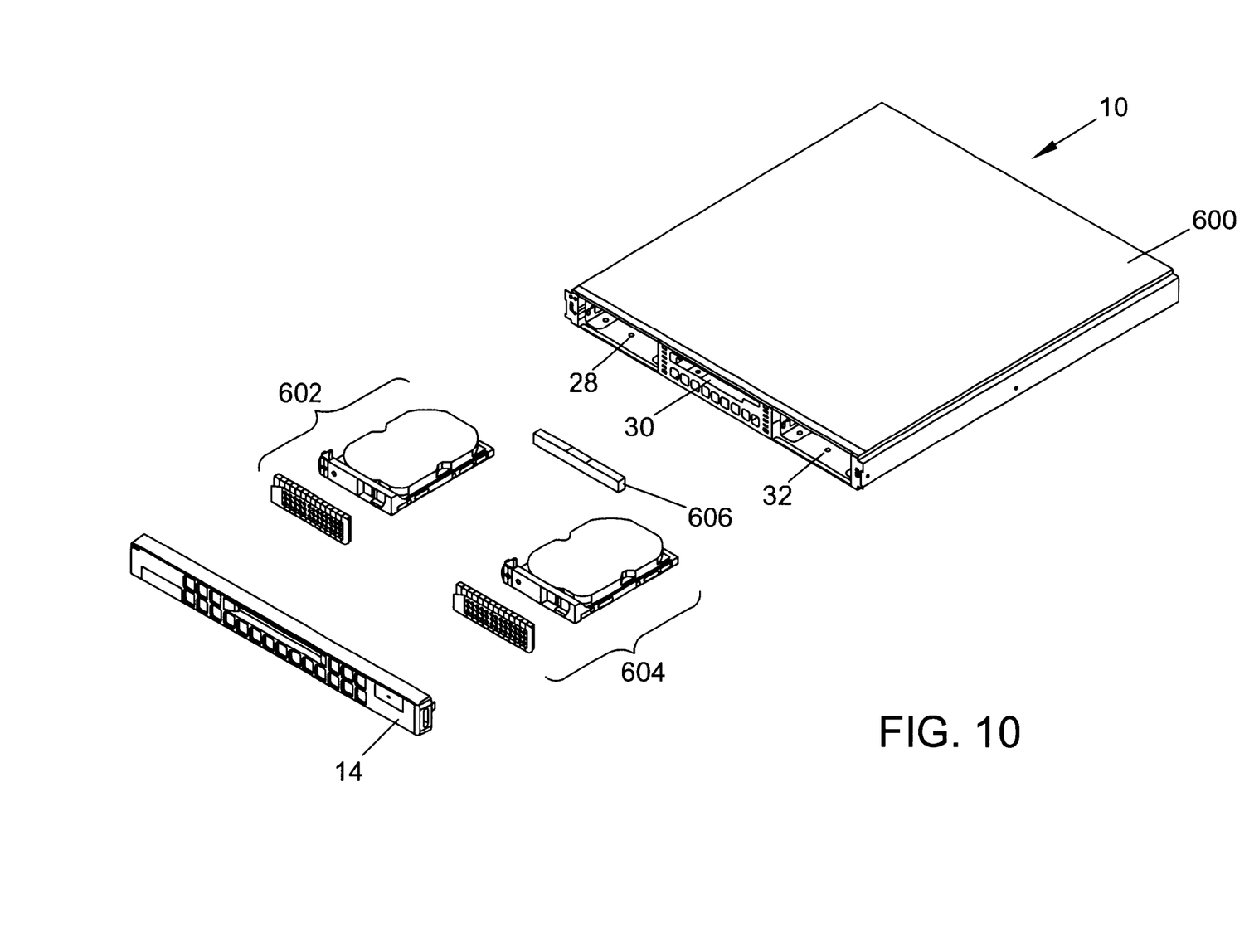
FIG. 10 illustrates the final assembly of the unit of FIG. 1.

FIG. 10 shows a final stage of mounting the media drives 602, 604 and/or blanking plates 606 in the drive bays 28, 32 and 30 the fitting of the front panel 14.

Thus there has been described a support mechanism and method for a circuit card. The support mechanism includes a support member (slide) which forms a fixed part. The support member defines a guide. It also includes a slideable member for engaging the circuit card. The slideable member (slider) is slideable along the guide to a position for engaging the card. The slider defines a jaw for engaging the circuit card. The jaw can be provided with a protrusion for engaging with a hole in the corner of a circuit card, for example a PCI card. The mechanism enables the supporting of cards of different lengths due to the slideability of the slide along the guide. The guide and the slider can be formed with inter-engaging structures of appropriate shapes, for example, co-operating dovetail shapes.

It will be appreciated that a specific embodiment and some alternatives have been described hereinabove.

However, the present embodiment is merely illustrative, and is not limitative and many changes to the embodiment may be made within the scope of the present invention.

For example, although the application has been described in particular with respect to the mounting of a PCI card, the invention could be used for the mounting of other forms of circuit cards. Also, although the invention has been particularly described in the context of a low profile rack-mountable unit, and in particular a processor unit, it will be appreciated the invention is not limited thereto, and that it may be employed for mounting cards in other environments and applications.

Also, although a particular example of a sequence of assembly of the unit incorporating the slide and slider arrangement has been described, another order of assembly may be employed. For example, the unit may be supplied as standard without a card to be mounted in the slider and slider arrangement, and this can then be subsequently installed by a user. Also, it will be appreciated that the slide and slider arrangement may be supplied as a separate component for use with, for example, a rack-mountable, or other, unit.

Thus, it will be appreciated that although particular embodiments of the invention have been described, many modifications, additions, substitutions and omissions may be made to the described embodiments within the spirit and scope of the present invention as defined in the appended claims.

What is claimed is:

1. A support mechanism for a circuit card, the support mechanism comprising a support member defining a guide, and a card engaging member having a guide follower that slideably engages the guide such that the card engaging member is slideable with respect to the support member to a position to engage a part of the circuit card, a detent mechanism being provided to locate the guide follower with respect to the circuit card.

2. The support mechanism of claim 1, wherein one of the guide and the guide follower is a rail and the other of the guide and guide follower is a slot of complementary shape to the rail.

3. The support mechanism of claim 2, wherein the rail is a projecting rail.

4. The support mechanism of claim 2, wherein card engaging member is held in a slideable engagement with respect to the support member by inter-engagement of the slot and the rail.

5. The support mechanism of claim 4, wherein the rail has a head portion that is wider than a base portion.

6. The support mechanism of claim 5, wherein the rail has a dovetail-shaped cross-section.

7. The support mechanism of claim 2, wherein the guide is a rail.

8. The support mechanism of claim 2, wherein the guide follower is a rail.

9. The support mechanism of claim 1, wherein the card engaging member comprises first and second projections forming a jaw for receiving the circuit card.

10. The support mechanism of claim 1, wherein the card engaging member comprises first and second projections defining a slot therebetween for receiving the circuit card.

11. The support mechanism of claim 10, wherein the detent mechanism comprises a projection for engaging in a hole in the circuit card.

12. The support mechanism of claim 1, wherein the detent mechanism comprises a projection for engaging in a hole in the circuit card.

13. The support mechanism of claim 1, wherein the support member comprises a wall portion for dividing a card receiving bay from a further bay within a housing.

14. The support mechanism of claim 13, wherein the support member comprises formations for securing the support member within the housing.

15. The support mechanism of claim 14, wherein the formations include a flange.

16. The support mechanism of claim 14, wherein the formations include a threaded hole for receiving a screw.

17. The support mechanism of claim 1, wherein the support member is formed of plastics.

18. The support mechanism of claim 1, wherein the card engaging member is formed of plastics.

19. The support mechanism of claim 1, wherein the part of the circuit card is a free corner of the circuit card.

20. Electrical apparatus including a housing, a circuit card and a support mechanism for supporting a part of the circuit card within the housing, the support mechanism comprising a support member defining a guide and a card engaging member having a guide follower that slideable engages the guide such that the card engaging member is slideable with respect to the support member to a position to engage the part of the circuit card, a detent mechanism being provided to locate the guide follower with respect to the circuit card.

21. The electrical apparatus of claim 20, wherein the part of the circuit card is a free corner of a PCI card.

22. The electrical apparatus of claim 20, further comprising a processor card carrying a processor, the support member forming a dividing wall between a circuit card bay for receiving the circuit card and a processor card bay for receiving the processor card.

23. The electrical apparatus of claim 22, comprising a first fan unit for cooling the circuit card bay and second fan unit for cooling the processor card bay.

24. A support mechanism for a circuit card, the support mechanism comprising first means defining a guide and second means engageable with the circuit card, the second means being arranged to be slideable along the guide to a position at which it engages a part of the circuit card, a detent mechanism being provided to locate the guide follower with respect to the circuit card.

25. A method of supporting part of a circuit card within a housing, the method comprising locating a support guide within the housing and sliding a card engaging member having a guide follower along the support guide to a position at which the card engaging member engages the part of the card, a detent mechanism being provided to locate the guide follower with respect to the circuit card.

26. The method of claim 25, wherein the part of the circuit card is a free corner of the circuit card.

27. The method of claim 25, wherein the detent mechanism is caused to engage a hole in a free corner of the circuit card.

28. The method of claim 25, wherein the circuit card is a PCI card.

\* \* \* \* \*